United States Patent
Lee et al.

(10) Patent No.: US 11,922,031 B1
(45) Date of Patent: Mar. 5, 2024

(54) APPARATUS WITH DIRECTED REFRESH MANAGEMENT MECHANISM

(71) Applicant: Micron Technology, Inc., Boise, ID (US)

(72) Inventors: Joo-Sang Lee, Frisco, TX (US); Navya Sri Sreeram, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/952,088

(22) Filed: Sep. 23, 2022

(51) Int. Cl.
*G06F 3/06* (2006.01)
*G11C 29/00* (2006.01)

(52) U.S. Cl.
CPC .......... *G06F 3/0619* (2013.01); *G06F 3/0659* (2013.01); *G06F 3/0673* (2013.01); *G11C 29/783* (2013.01)

(58) Field of Classification Search
None
See application file for complete search history.

(56) References Cited

U.S. PATENT DOCUMENTS

| | | | | |
|---|---|---|---|---|
| 2002/0001246 A1* | 1/2002 | Hidaka | ................. | G11C 11/406 365/222 |
| 2006/0265556 A1* | 11/2006 | Janzen | ................. | G11C 11/4091 365/222 |
| 2008/0151670 A1* | 6/2008 | Kawakubo | ............ | G11C 11/406 365/222 |
| 2013/0132685 A1* | 5/2013 | Vogelsang | .......... | G06F 13/1694 711/154 |
| 2017/0213586 A1* | 7/2017 | Kang | .................... | G06F 3/0673 |
| 2017/0270997 A1* | 9/2017 | Kim | .................... | G11C 11/4087 |
| 2020/0321049 A1* | 10/2020 | Meier | ............... | G11C 11/40622 |
| 2021/0225433 A1* | 7/2021 | Kaminski | ........... | G11C 11/4091 |
| 2022/0157373 A1* | 5/2022 | Choi | ................ | G11C 11/40622 |
| 2022/0189532 A1* | 6/2022 | Nale | .................... | G06F 3/0659 |
| 2022/0293162 A1* | 9/2022 | Nale | ................. | G11C 11/40611 |

OTHER PUBLICATIONS

E. Cooper-Balis and B. Jacob, "Fine-Grained Activation for Power Reduction in DRAM," in IEEE Micro, vol. 30, No. 3, pp. 34-47, May-Jun. 2010, doi: 10.1109/MM.2010.43. (Year: 2010).*

* cited by examiner

*Primary Examiner* — Daniel F. McMahon

(74) *Attorney, Agent, or Firm* — Perkins Coie LLP

(57) ABSTRACT

Methods, apparatuses, and systems related to operations for controlling direct refresh management (DRFM) operations. A memory may process a DRFM sample command using bank logic located downstream from a command decoder. The bank logic may be configured to process the DRFM sample command according to an operating state of a targeted memory bank.

20 Claims, 8 Drawing Sheets

| Function | Abbreviation | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|---|
| | | | | | | | | | CA Pins | | | | | | | |
| Write Pattern w/Auto Precharge | WRPA | L | H | L | L | H | L | H | BA0 | BA1 | BG0 | BG1 | BG2 | CID0 | CID1 | CID2 |
| | | H | V | C3 | C4 | C5 | C6 | C7 | C8 | C9 | C10 | V or DRFM=L | AP=L | H | V | CID3 |
| Write w/Auto Precharge | WRA | L | H | L | L | H | L | BL*=L | BA0 | BA1 | BG0 | BG1 | BG2 | CID0 | CID1 | CID2 |
| | | H | V | C3 | C4 | C5 | C6 | C7 | C8 | C9 | C10 | V or DRFM=L | AP=L | WR PartialT=L | V | CID3 |
| Function | Abbreviation | CS_n | CA0 | CA1 | CA2 | CA3 | CA4 | CA5 | CA6 | CA7 | CA8 | CA9 | CA10 | CA11 | CA12 | CA13 |
| | | | | | | | | | CA Pins | | | | | | | |
| Read w/Auto Precharge | RDA | L | H | L | H | H | H | BL*=L | BA0 | BA1 | BG0 | BG1 | BG2 | CID0 | CID1 | CID2 |
| | | H | C2 | C3 | C4 | C5 | C6 | C7 | C8 | C9 | C10 | V or DRFM=L | AP=L | V | V | CID3 |
| Precharge | PREpb | L | H | H | H | H | H | CID3 or DRFM=L | BA0 | BA1 | BG0 | BG1 | BG2 | CID0 | CID1 | CID2 |

*FIG. 1B*

APPARATUS WITH DIRECTED REFRESH MANAGEMENT MECHANISM

TECHNICAL FIELD

The disclosed embodiments relate to devices, and, in particular, to semiconductor memory devices with directed refresh management mechanism.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. The memory devices can include Double Data Rate (DDR) RAM devices that implement DDR interfacing scheme (e.g., DDR4, DDR5, etc.) for high-speed data transfer.

With technological advancements in various areas and increasing applications, the market is continuously looking for faster, more efficient, and smaller devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the semiconductor devices must facilitate increasing number of functions without disturbing previously available functions and features. Moreover, the need to reduce costs, improve efficiencies and performance, and meet competitive pressures adds an even greater pressure to find answers to these problems.

BRIEF DESCRIPTION OF THE DRAWINGS

FIG. 1B is an example set of refresh commands in accordance with an embodiment of the present technology.

DETAILED DESCRIPTION

Figure 1A:
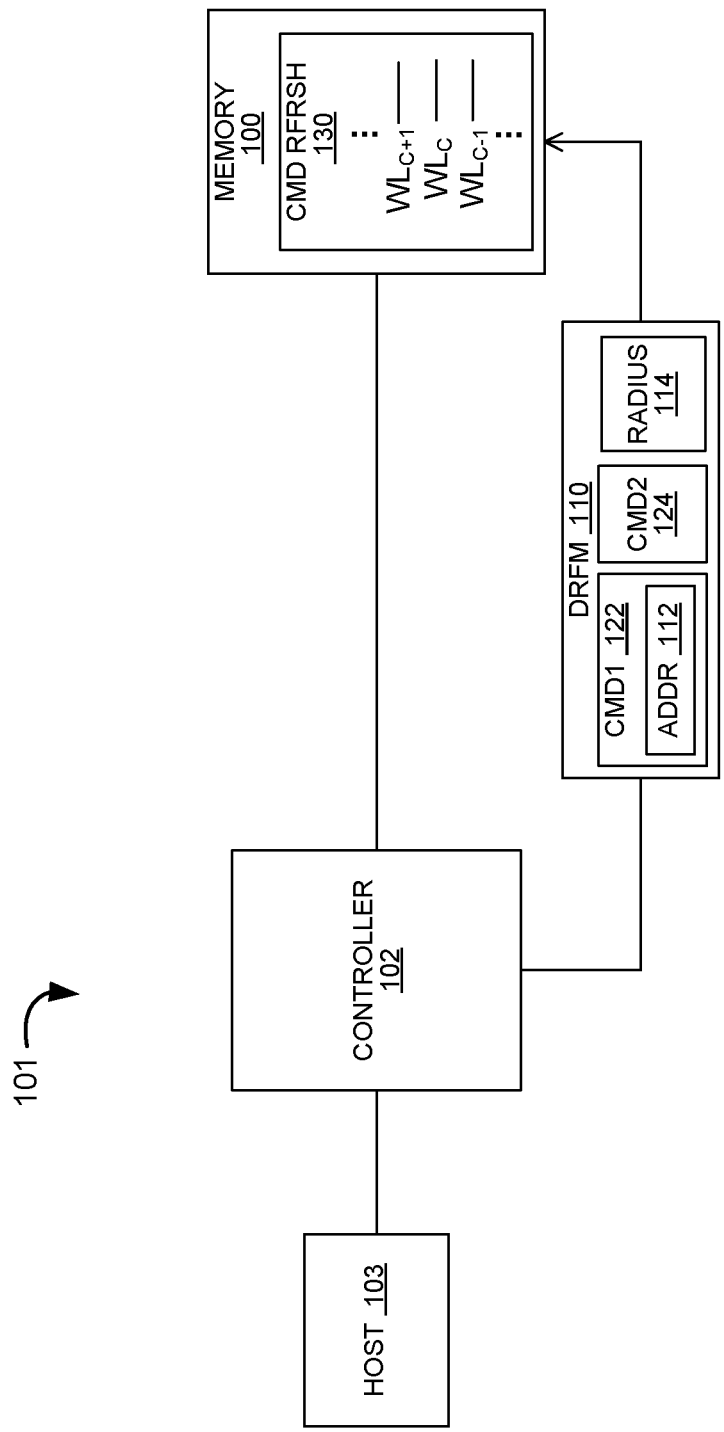
FIG. 1A is a block diagram of an example environment in which an apparatus may operate in accordance with an embodiment of the present technology.

As described in greater detail below, the technology disclosed herein relates to an apparatus, such as memory systems, systems with memory devices, memory controllers, related methods, etc., for managing externally commanded refresh operations (e.g., Direct Refresh Management (DRFM) operations). The apparatus can include a refresh management circuit (e.g., bank logic) that is at or closer to one or more memory banks/arrays (e.g., downstream from a command decoder) and configured to process the DRFM commands and corresponding refresh location information. For example, the logic can be configured to block DRFM row address capturing commands issued to closed banks.

In some embodiments, a computing system can use a control device (e.g., a memory controller) to command and initiate refresh operations, such as row hammer refreshes (RHRs), at a memory device (e.g., DRAM). The control device can use a set of commands, such as an address capture/sampling command and a service or initiation command, to command the refresh operation. For example, the control device can track a target wordline (WL) (e.g., an aggressor or a hammered WL) and use one of the commands to communicate the target WL to the memory device. The control device can further communicate a number of neighboring WLs (e.g., a number of victim WLs surrounding/adjacent to the target WL) to the memory device. Based on the communicated information and in response to receiving the initiation command, the memory device can implement a refresh operation to replenish or reestablish the charge levels at the neighboring WLs.

In implementing the refresh operation, the capture command may arrive at a closed bank. For example, a precharge (PRE) command may be provided to a closed bank. Implementing the PRE command at the closed bank may inadvertently overwrite previously captured row address (e.g., previous implementation of the capture command). In other words, the apparatus may be required to determine whether the bank is open or closed before implementing the PRE command associated with the capture command. Failure to ignore or block the capture command at the closed bank may cause erroneous disruption/update of the previously stored row address (e.g., the target WL) and cause the memory device to refresh the wrong WLs.

In response to the PRE command and the capture command, the memory device may use a command decoder therein to initiate the precharging row operation. The memory device can further include the refresh management circuit located downstream from the command decoder (e.g., between the command decoder and a memory array) and configured to process the capture command according to the closed/opened status of the memory bank. In some embodiments, the refresh management circuit can include refresh logic that uses a delayed version (via, e.g., a flipflop) of open/close status in response to the DRFM capture command for comparison with the open/close status of the memory bank. Accordingly, the refresh management circuit can block the DRFM capture command when the targeted memory bank is closed while implementing/initiating the related PRE command response (e.g., the precharging operation) within the required response window.

Example Environment

FIG. 1A is a block diagram of an example environment 101 in which an apparatus (e.g., a memory controller, a memory, or a combination thereof) may operate in accordance with an embodiment of the present technology. The example environment 101 can correspond to a computing device or system that includes a host 103, a memory controller 102, and a memory 100 functionally coupled to each other. The memory 100 can include a memory device or system, such as a volatile memory, a non-volatile memory, or a combination device/system. For example, the memory 100 can include a DRAM. The host 103 can include one or more processors.

The example environment 101 can include the host 103 that can function according to an operating system and store information to and/or access information stored in the memory 100 via the memory controller 102. For example, the host 103 can send operational communications (e.g., read/write commands, write data, addresses, etc.) to the memory controller 102. The example operating environments can include a computing system having a central processing unit (CPU) as the host 103 interacting with a memory controller to write data to and read data from a DRAM. The memory 100 can also send read data (e.g., as a response to a read request) back to the system controller as the operational communications.

The memory controller 102 can include a digital circuit configured to manage the flow of the data to or from the memory 100 (such as according to the address and/or the operation. The memory controller 102 may include circuits and/or functions (e.g., software and/or firmware instructions) that provide an interface (via, e.g., buffering communications) between the host 103, the memory 100, and/or the rest of the computing system.

In some embodiments, the memory controller 102 can be configured to initiate an externally commanded refresh operation at the memory 100. For example, the memory controller 102 can send one or more DRFM commands 110 that causes the memory 100 to implement/perform a commanded refresh operation 130. The commanded refresh operation 130 can include a RHR operation that occurs separate from, independent of, and/or in addition to refresh operations controlled/scheduled internally by the memory 100.

As an illustrative example, the memory controller 102 can be configured to locally track a target address 112 and a corresponding number of access operations (e.g., reads) thereat. When the tracked access count reaches a threshold condition, the memory controller 102 can send the one or more DRFM commands 110 to refresh one or more sets of the WLs surrounding or adjacent to the tracked address 112.

In some embodiments, the DRFM commands 110 can include a set of two commands, such as a first command 122 and a second command 124, that provide different information or components for the commanded refresh operation 130. For example, the first command 122 can include a row address sampling command that communicates (1) that the commanded refresh operation 130 is to be implemented and/or (2) the tracked address 112 corresponding to the hammered/aggressor row. The second command 124 can include an initiation command/marker. The second command 124 can correspond to a radius 114 that identifies a number of neighboring WLs. The memory controller 102 can provide the radius 114, such as by writing to a shared memory location (e.g., a configuration/mode register).

In response to receiving the first command 122, the memory 100 can latch or store the tracked address 112 and prepare to implement the commanded refresh operation 130. In response to receiving the second command 124, the memory 100 can execute a series of actions to replenish or reestablish the stored charges to initially targeted levels for the number of neighboring WLs surrounding the tracked address 112. For example, when the radius 114 is one, the memory 100 can refresh $WL_{c+1}$ and $WL_{c-1}$ immediately surrounding or adjacent to the tracked address 112 $WL_c$. When the radius 114 is two, the memory 100 can also refresh the next surrounding/adjacent WLs (e.g., $WL_{c+2}$ and $WL_{c-2}$) in addition to $WL_{c+1}$ and $WL_{c-1}$. The memory 100 can similarly refresh three, four, or more sets of surrounding/adjacent WLs for corresponding numbers indicated by the radius 114.

FIG. 1B is an example set of refresh commands (e.g., different types of the first command 122 of FIG. 1A) in accordance with an embodiment of the present technology. For example, the memory controller 102 of FIG. 1A and/or the memory 100 of FIG. 1A can selectively communicate DRFM row address sampling commands using one or more existing commands, such as: write pattern with auto precharge (WRPA) command, a write with auto precharge (WRA) command, a read with auto precharge (RDA) command, and a precharge per bank (PREpb) command. Each of these existing commands can use a predetermined set/locations of bits to identify a specific bank. For example, for the memory 100 having 32 banks (per, e.g., 16G DDR5 memory architecture), the refresh commands can use BG[2:0] and BA[1:0] to select a targeted bank. With these existing commands, the memory controller 102 can control one or more predetermined bits (e.g., CA5 and/or CA9) to communicate the DRFM capture command.

Example Memory

Figure 2A:
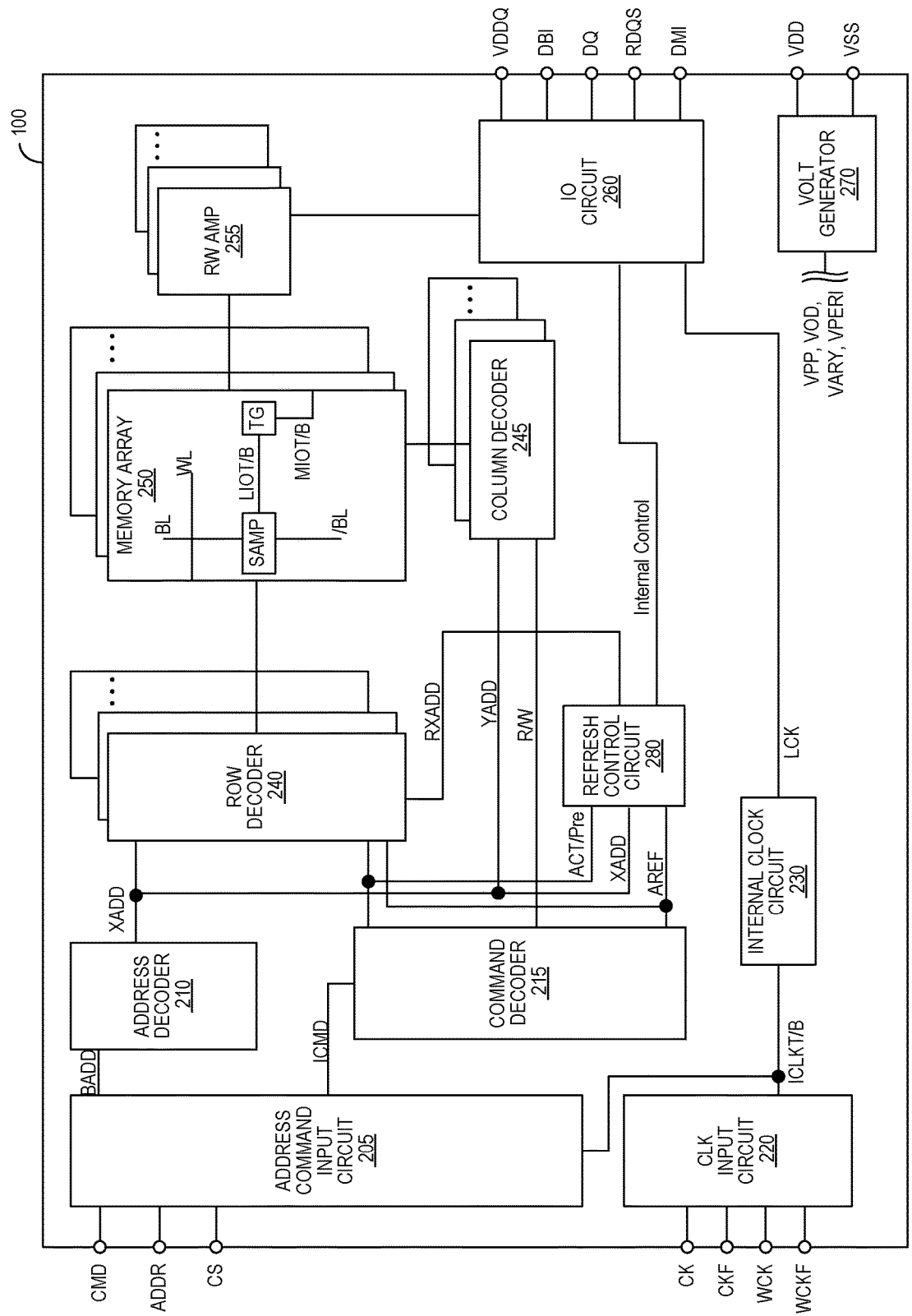
FIG. 2A is a block diagram of an apparatus in accordance with an embodiment of the present technology.

FIG. 2A is a block diagram of an apparatus (e.g., the memory 100 including a semiconductor die assembly, including a 3DI device or a die-stacked package) in accordance with an embodiment of the present technology. For example, the memory 100 can include a DRAM (e.g., DDR4 DRAM, DDR5 DRAM, LP DRAM, HBM DRAM, etc.), or a portion thereof that includes one or more dies/chips. In some embodiments, the memory 100 can include synchronous DRAM (SDRAM) of DDR type integrated on a single semiconductor chip.

The memory 100 may include an array of memory cells, such as memory array 250. The memory array 250 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The memory 100 may employ a plurality of external terminals that include command and address terminals coupled to a command bus and an address bus to receive command signals (CMD) and address signals (ADDR), respectively. The memory 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 2A) from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a controller (e.g., the memory controller 102 of FIG. 1A). The command signals may represent various memory commands from the memory controller (e.g., including access commands, which can include read commands and write commands). The chip select signal may be used to select the memory 100 to respond to commands and addresses provided to the command and address terminals. When an active chip select signal is provided to the memory 100, the commands and addresses can be decoded and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The command decoder 215 may further include one or more registers for tracking various counts or values (e.g., counts of refresh commands received by the memory 100 or self-refresh operations performed by the memory 100).

Read data can be read from memory cells in the memory array 250 designated by row address (e.g., address provided with an active command) and column address (e.g., address provided with the read). The read command may be received by the command decoder 215, which can provide internal commands to input/output circuit 260 so that read data can be output from the data terminals DQ, RDQS, DBI, and DMI via read/write amplifiers 255 and the input/output circuit 260 according to the RDQS clock signals. The read data may be provided at a time defined by read latency information RL that can be programmed in the memory 100, for example, in a mode register (not shown in FIG. 2A). The read latency information RL can be defined in terms of clock cycles of the CK clock signal. For example, the read latency information RL can be a number of clock cycles of the CK signal after the read command is received by the memory 100 when the associated read data is provided.

Write data can be supplied to the data terminals DQ, DBI, and DMI according to the WCK and WCKF clock signals. The write command may be received by the command decoder 215, which can provide internal commands to the input/output circuit 260 so that the write data can be received by data receivers in the input/output circuit 260, and supplied via the input/output circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the memory 100, for example, in the mode register (not shown in FIG. 2A). The write latency WL information can be defined in terms of clock cycles of the CK clock signal. For example, the write latency information WL can be a number of clock cycles of the CK signal after the write command is received by the memory 100 when the associated write data is received.

The power supply terminals may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in the sense amplifiers included in the memory array 250, and the internal potential VPERI can be used in many other circuit blocks.

The power supply terminal may also be supplied with power supply potential VDDQ. The power supply potential VDDQ can be supplied to the input/output circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 260 so that power supply noise generated by the input/output circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable (not shown in FIG. 2A) from the command/address input circuit 205. For example, the internal clock circuit 230 can include a clock path (not shown in FIG. 2A) that receives the internal clock signal ICLK and provides various clock signals to the command decoder 215. The internal clock circuit 230 can further provide input/output (IO) clock signals. The IO clock signals can be supplied to the input/output circuit 260 and can be used as a timing signal for determining an output timing of read data and the input timing of write data. The IO clock signals can be provided at multiple clock frequencies so that data can be output from and input to the memory 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The memory 100 can be connected to any one of a number of electronic devices capable of utilizing memory for the temporary or persistent storage of information, or a component thereof. For example, a host device (e.g., the host 103 of FIG. 1A) of memory 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory 100, although in other embodiments, the host device may be indirectly connected to memory device (e.g., over a networked connection or through intermediary devices).

The memory 100 can include a refresh control circuit 280 configured to control refreshing of the information of the corresponding memory cells or WLs. The refresh control circuit 280 can be configured to control internally managed/scheduled refresh operations and/or the commanded refresh operation 130 of FIG. 1A.

For example, as inputs for the internally managed or the commanded operations, the refresh control circuit 280 can receive the decoded row address signal (XADD) from the address decoder 210, a refresh signal (AREF) from the command decoder 215, an active signal (ACT) and/or a precharge signal (Pre) from the command decoder 215, etc. The command decoder 215 can generate the active signal (ACT) (e.g., a pulse signal) when the command signals (CMD) indicates row access (e.g., active command). The command decoder 215 can generate the precharge signal (Pre) (e.g., a pulse signal) when the command signal (CMD) indicates pre-charge. The command decoder 215 can generate the refresh signal (AREF) (e.g., a pulse signal) when the command signal (CMD) indicates an auto-refresh command and/or a self-refresh entry command. Otherwise, the command decoder 215 can provide the target address 112 of FIG. 1A to the refresh control circuit 280 for the commanded refresh operation 130. The refresh control circuit 280 can include circuitry (e.g., logic) configured to process the target address 112 and the corresponding address capture command according to an operating state of one or more memory cells (e.g., opened/closed status of the targeted bank(s)). Accordingly, the memory 100 can implement a refresh operation to refresh (e.g., increase stored charges) targeted locations. Details regarding the refresh control circuit 280 are described below.

DRFM Control Circuit

Figure 2B:
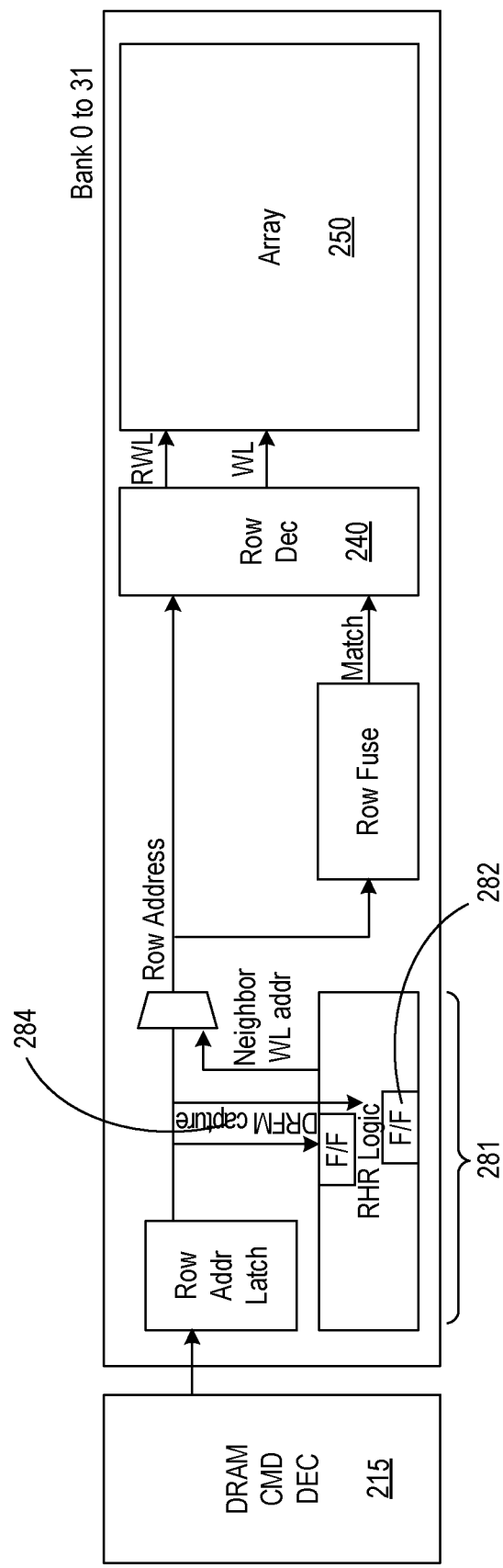
FIG. 2B is a block diagram of an example refresh control circuit in accordance with an embodiment of the present technology.

FIG. 2B is a block diagram of an example refresh control circuit (e.g., the refresh control circuit 280 of FIG. 2A) in accordance with an embodiment of the present technology. In some embodiments, the refresh control circuit can include a RHR logic 281 (e.g., bank logic) downstream from the command decoder 215 and configured to, among other things, control the commanded refresh operation 130 of FIG. 1A. In other words, the memory 100 can control implementation of the commanded refresh operation 130 at the RHR logic 281 or between the command decoder 215 and the array 250 and/or the row decoder 240.

In some embodiments, the DRFM commands 110 can be accompanied by or facilitated with a PRE command as described above. As such, the memory 100 may be required to implement the precharging operation within a required time window in response to the PRE portion of the received command while processing the DRFM portion. The command decoder 215 can respond to the PRE portion of the command and pass the DRFM portion to the refresh control circuit 280.

The refresh control circuit 280 can use the RHR logic 281 to process the DRFM command 110. The RHR logic 281 can be configured to receive, retain, and/or process the DRFM command 110 (e.g., the first command 122 of FIG. 1A). For example, the RHR logic 281 can be configured to receive and temporarily retain the first command 122 and the target address 112 of FIG. 1A. While retaining the information, the RHR logic 281 can determine an opened/closed status of the memory bank indicated by the target address 112. The RHR logic 281 can be configured to pass or continue processing the first command 122 and the target address 112, such as by generating or activating a DRFM capture signal 284, when the targeted bank is open. Otherwise, when the targeted memory bank is closed, the RHR logic 281 can be configured to block propagation of the first command 122 and/or the target address 112, such by maintaining the DRFM capture signal 284 at an inactive state. As a result, the refresh control circuit 280 can respond to the DRFM capture signal 284 by (1) latching or updating the tracked refresh address with the target address 112 when the memory bank is in the opened state and (2) ignoring the target address 112 and retaining the previously stored address when the memory bank is in the closed state.

Figure 2C:
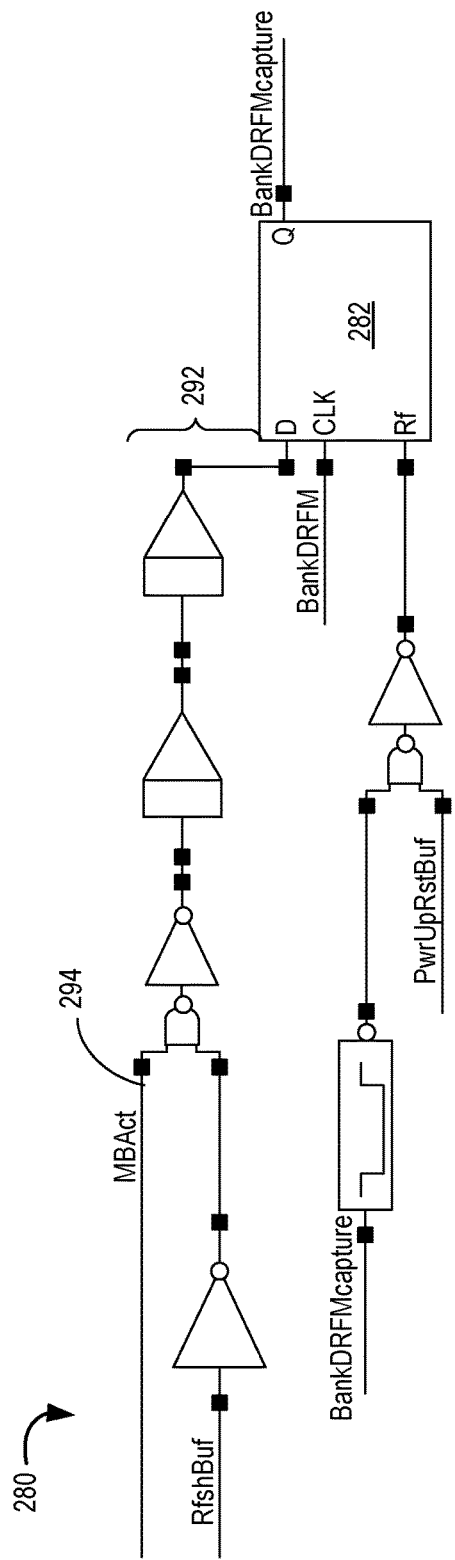
FIG. 2C is a first detailed example of a refresh control logic in accordance with an embodiment of the present technology.

In some embodiments, the RHR logic 281 can include a DRFM capture register 282 and corresponding control logic configured to process the DRFM commands 110 and/or control the DRFM capture signal 284. FIG. 2C is a first detailed example of a refresh control logic (e.g., the RHR logic 281 of FIG. 2B or a portion thereof) in accordance with an embodiment of the present technology. The refresh control logic can include a status analysis circuitry 292 configured to determine whether the corresponding bank is in an opened state or a closed state. For example, the status analysis circuitry 292 can include a set of circuit components (e.g., NAND, inverter, buffer, delay, and/or the like) that receive one or more control signal (e.g., a refresh buffer signal (RfshBuf)) along with a bank activation signal 294 (MBAct). The status analysis circuitry 292 can include components to delay (via, e.g., a set of one or more delay buffers as illustrated in FIG. 2C) the bank activation signal according to a predetermined duration such that the delayed signal overlaps with a BankDRFM input (e.g., the Bank DRFM command from the command decoder) to the DRFM capture register 282. The status analysis circuitry can further include an inverter for the refresh buffer signal since the signal is used for the activation command.

The status analysis circuit 292 can provide the corresponding output (e.g., an output at least partially representative of the bank activation signal 294) to the DRFM capture register 282, such as a flip flop. Accordingly, the DRFM capture register 282 can output or propagate the DRFM capture signal 284 (e.g., a repetition of the DRFM capture portion provided by the command decoder 215, such as the BankDRFMcapture signal) according to the output from the status analysis circuit 292.

In some embodiments, the DRFM capture register 282 can receive a processed input signal that corresponds to the BankDRFMcapture signal. For example, the BankDRFMcapture signal from the command decoder 215 can be used to generate a negated and/or delayed pulse. The resulting pulse can be combined/processed with a reset and/or a buffer signal (e.g., PwrUpRstBuf), such as using an AND/NAND, an inverter, or a combination thereof. The resulting output can be provided to the DRFM capture register 282 as a reference signal for generating or propagating the BankDRFMcapture to downstream circuits.

According to the above-described signals, the RHR logic 281 can propagate or block the DRFM capture command according to the status of the targeted bank and reduce/prevent unintended corruptions or updates in the tracked refresh location (e.g., the aggressor/hammered row) identified by the controller. The remainder of the RHR logic 281, the multiplexer and/or the fuse match circuit of FIG. 2B, or a combination thereof can be used to latch or store the target/hammered address according to the output of the DRFM capture register 282.

Figure 2D:
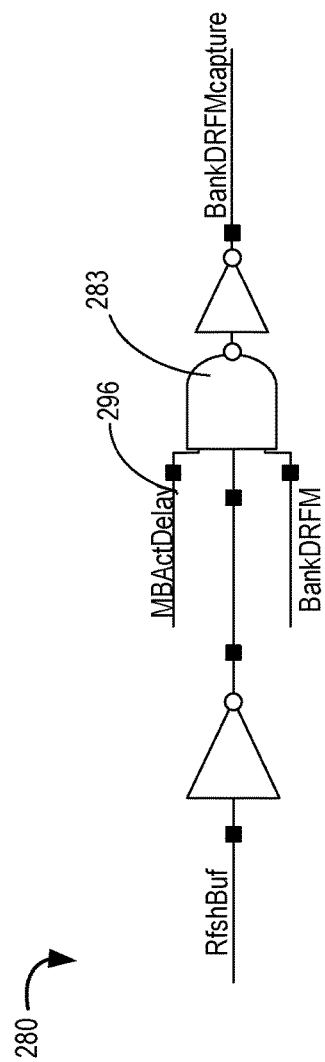
FIG. 2D is a second detailed example of the refresh control logic in accordance with an embodiment of the present technology.

FIG. 2D is a second detailed example of the refresh control logic (e.g., the RHR logic 281 of FIG. 2B or a portion thereof) in accordance with an embodiment of the present technology. The refresh control logic can include a different implementation of the DRFM capture register 282. For example, the second example can include a combining component 283 (e.g., a 3-signal NAND device) that receives a delayed activation signal 296 (e.g., a delayed version of the bank activation signal 294 of FIG. 2C), the control signal (e.g., a refresh buffer signal (RfshBuf) or a negated signal thereof), and the BankDRFM input (e.g., the Bank DRFM command from the command decoder). The combining component 283 can generate the output Bank DRFM capture based on logically combining or processing the input signals.

Process Timing

Figure 3:
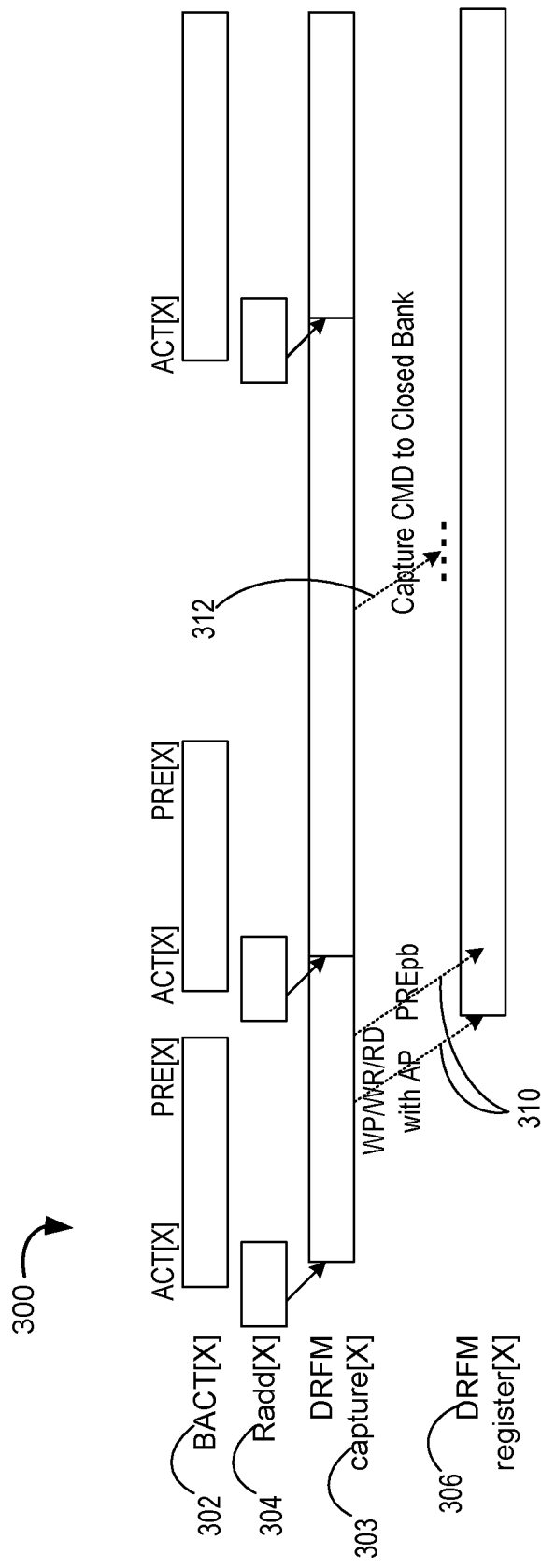
FIG. 3 is an example timing diagram for a refresh operation in accordance with an embodiment of the present technology.

FIG. 3 is an example timing diagram 300 for a refresh operation in accordance with an embodiment of the present technology. The timing diagram 300 can represent processing of the DRFM commands 110 (e.g., the first command 122 of FIG. 1A) with respect to the opened and closed status of the targeted bank. The example illustrated in FIG. 3 can correspond to operations at a targeted bank 'X'.

In some embodiments, the memory 100 of FIG. 1A can use a bank activation signal 302 (e.g., BACT[X]) to coordinate activation and precharging operation at the targeted bank. For example, the memory 100 (via, e.g., the command decoder 215 of FIG. 2B) can use (1) the BACT signal activation (e.g., low to high transition) to coordinate (e.g., the timing for) activation of the corresponding row/WL and/or (2) the BACT signal deactivation to coordinate the precharging operation for the row/WL.

The memory 100 can process an address 304 (e.g., Radd[X], such as representative of the target address 112 of FIG. 1A) and the first command 122 of FIG. 1A (e.g., DRFM capture [X] command) for the bank activation signal 302. The first command 122 can include Write Pattern (WP), Write (WR), and/or Read (RD) commands with Auto Precharge (AP). The first command 122 can further include Precharge (PREpb). The memory 100 can use the RHR logic 281 of FIG. 2B and the DRFM control logic therein (FIG. 2C) to effectively perform an AND operation between BACT signal and/or a falling edge thereof with the DRFM capture signal at each bank instead of at the command decoder.

In response to the bank activation signal 302, the refresh control circuit 280 can latch the refresh address at the row address latch (as shown in FIG. 2B) at bank 'X.' Accordingly, the memory control circuit 280 can update a DRFM capture value 303 at bank X with the address 304. The refresh control circuit 280 can process the latched value according to the open/close status of bank X. For example, the refresh control circuit 280 can update a DRFM register value 306 stored at the DRFM capture register 282 of FIG. 2B according to the bank status.

As illustrated in FIG. 3, a first DRFM capture 310 can be processed while the bank activation signal 302 is active. As such, the memory 100 can update the DRFM register value 306 based on the corresponding active/opened bank status. In contrast, when a second DRFM capture 312 is processed while the bank activation signal 302 is inactive, the memory 100 can block propagation of the command based on the corresponding inactive/closed bank status. Accordingly, the DRFM register value 306 can remain unchanged and unresponsive to the blocked capture command to closed bank.

Control Flow

Figure 4:
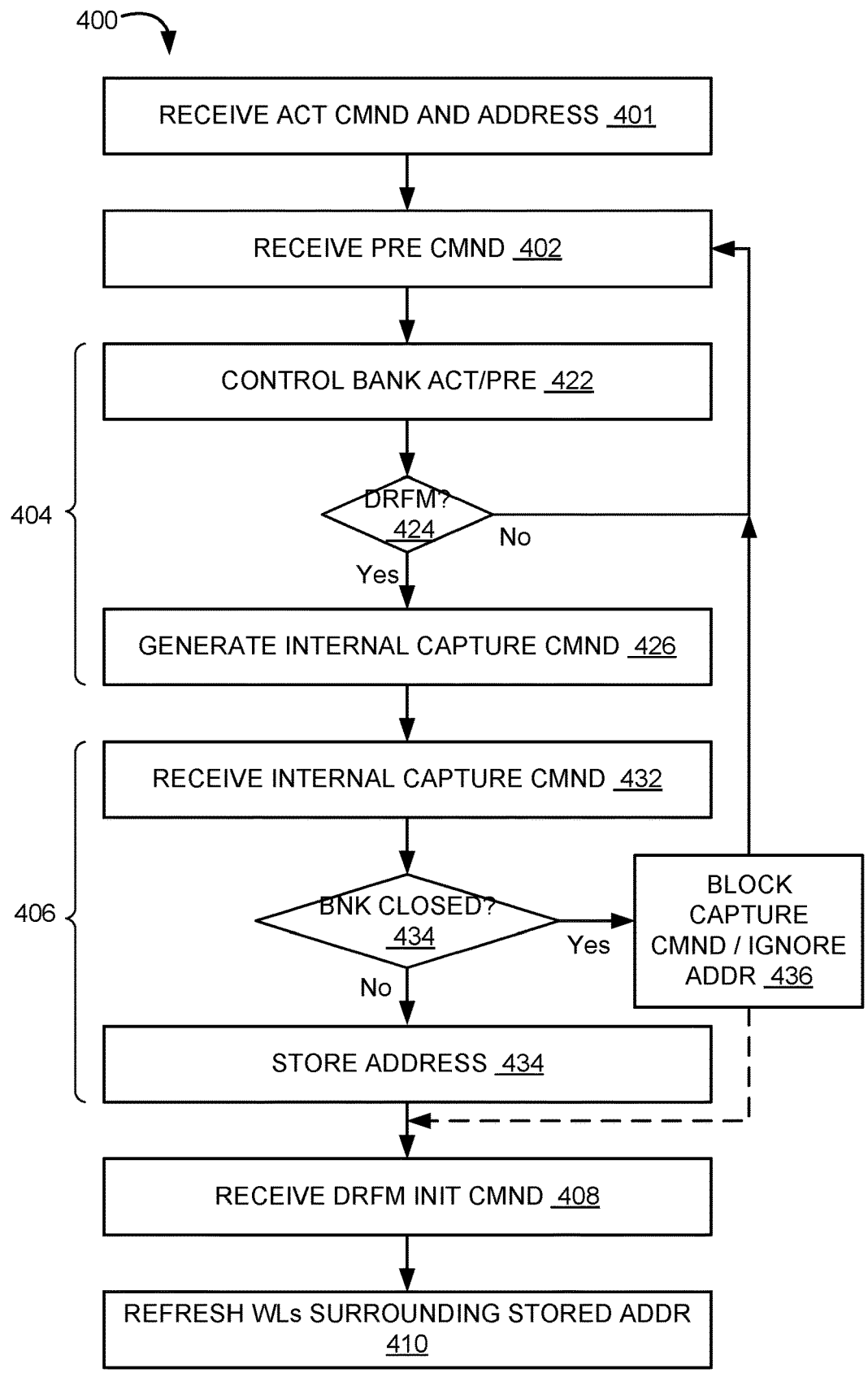
FIG. 4 is a flow diagram illustrating an example method of operating an apparatus in accordance with an embodiment of the present technology.

FIG. 4 is a flow diagram illustrating an example method 400 of operating an apparatus (e.g., the system 101 of FIG. 1A, the memory 100 of FIG. 1A, and/or the refresh control circuit 280 of FIG. 2A) in accordance with an embodiment of the present technology. The method 300 be for managing the DRFM commands, such as illustrated in the timing diagram 300 of FIG. 3.

At block 401, the memory 100 can receive an activation command and a corresponding address. For example, the memory 100 can receive the activation command for accessing a row and a corresponding address 112 of FIG. 1A from the controller 102 of FIG. 1A. At block 402, the memory 100 can receive a PRE command from an external device. For example, the memory 100 can receive the first command 122 of FIG. 1A (e.g., WRPA, WRA, RDA, or the PREpb illustrated in FIG. 1B) from the controller 102. The first command 122 can correspond to a precharging operation and the commanded refresh operation 130 of FIG. 1A that are both associated with the target address 112 as describe above.

At block 404, the memory 100 can operate a command decoder (e.g., the command decoder 215 of FIG. 2A) in response to the received PRE command. The memory 100 can operate the command decoder to process the received PRE command. For example, operating the command decoder can include controlling the activation and/or precharging of a targeted bank as illustrated at block 422. The command decoder 215 can activate the bank activation signal 302 of FIG. 3 to activate the targeted bank and deactivate the bank activation signal 302 to initiate the precharging operation.

At decision block 424, the memory 100 can operate the command decoder 215 to determine whether the received PRE command corresponds to a DRFM command. For example, the command decoder 215 can identify whether the DRFM indicator has been set in the received command as described above. When the received command corresponds to the DRFM command, the command decoder 215 can generate an internal capture command as illustrated in block 426. In other words, the command decoder 215 can identify that the DRFM indicator has been set and identify the received PRE command as a DRFM row address sampling command. In response, the command decoder 215 can generate the internal capture command (e.g., BankDRFMcapture and/or BankDRFM illustrated in FIGS. 2C and 2D) to process the DRFM portion of the received command using a downstream circuit (e.g., bank logic, such as the refresh control circuit 280).

Otherwise, when the received command does not correspond to the DRFM, the memory 100 can wait until a valid DRFM capture command to store a targeted/hammered address. When the memory 100 has previously received and stored a target address, the control flow may proceed to block 408.

At block 406, the memory 100 can operate bank logic (e.g., the refresh control circuit 280 and/or the DRFM control logic therein) to process the internal capture command. In other words, the memory 100 can use downstream circuit to process the DRFM portion of the received command. The use of the downstream circuit may introduce a delay in the DRFM processing and allow the command decoder 215 to address the more time sensitive precharging operation. As such, operating the bank logic can include receiving the internal capture command at the bank logic as illustrated at block 432.

At decision block 434, the bank logic can determine whether or not the targeted bank (e.g., the memory bank associated with or indicated by the DRFM sampling command) is closed. As described above, the bank logic can access the bank activation signal 302 for the determination. In some embodiments, the bank logic can include the flip flop receiving the internal capture command, the bank activation signal 302, and/or one or more derivations thereof as illustrated in FIG. 2C. In other embodiments, the bank logic can include a NAND component receiving at least the internal capture command, the bank activation signal 302, and/or one or more derivations thereof as illustrated in FIG. 2D.

The bank logic can control processing of the target address according to the operating state of the targeted memory bank. For example, the bank logic can store the received address at a predetermined location (e.g., a latch or a register) when the targeted bank is not closed (i.e., in the opened state) as illustrated at block 434. The bank logic can allow the internal capture command to propagate (via, e.g., the flip flop or the NAND) to subsequent circuitry that can use the propagated command to trigger or enable loading the received address to the predetermined location. The bank logic can store the address for subsequent implementation of the commanded refresh operation 130. The bank logic can overwrite previously stored data with the received address given the opened state of the targeted bank.

Otherwise, the bank logic can block propagation of the capture command and ignore the received address when the targeted bank is closed. Accordingly, the bank logic can retain the previously provided address in the predetermined location. In some embodiments, the control flow can return to block 402 to await a valid DRFM sampling command for implementing the commanded refresh operation 130. Otherwise, the control flow can proceed to block 408.

At block 408, the memory 100 can receive a DRFM initiation command (e.g., the second command 124 of FIG. 1A, such as the DRFM refresh or service command) from the memory controller 102. In response to the DRFM initiation command, the memory 100 can identify a set of one or more WLs surrounding the stored address according to the radius 114 of FIG. 1A. At block 410, the memory 100 can refresh the identified WLs surrounding the stored address. In other words, the memory 100 can implement the commanded refresh operation 130 to refresh the data stored in the one or more WLs surrounding the stored address.

Figure 5:
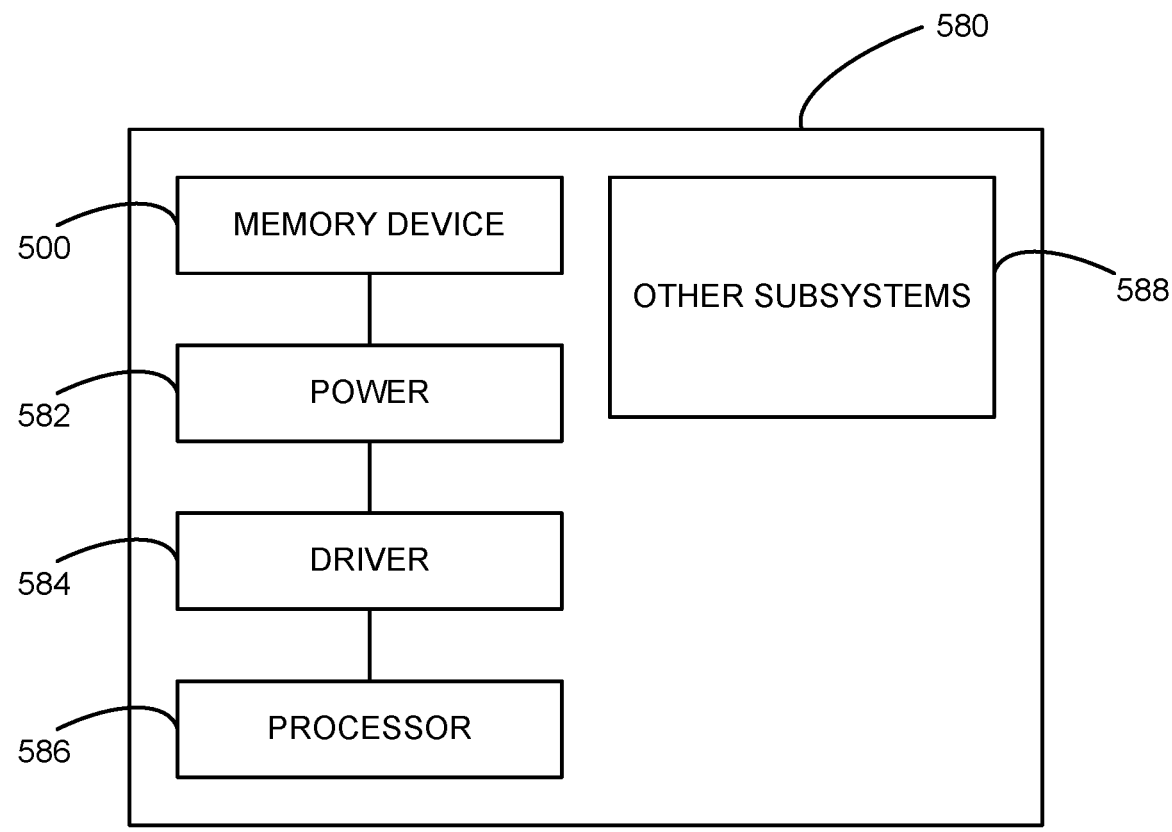
FIG. 5 is a schematic view of a system that includes an apparatus in accordance with an embodiment of the present technology.

FIG. 5 is a schematic view of a system that includes an apparatus in accordance with embodiments of the present technology. Any one of the foregoing apparatuses (e.g., memory devices) described above with reference to FIGS. 1A-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the apparatus described above with reference to FIGS. 1A-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

We claim:

1. A memory device, comprising:
a memory array including a plurality of memory cells configured to store data;
a communication connector coupled to the memory array and configured to receive an externally provided command from an external device, wherein the externally provided command is (1) associated with a precharging operation and a target address and (2) used for refreshing a set of neighboring wordlines surrounding the target address;
a command decoder coupled to and between the memory array and the communication connector, the command decoder configured to decode the received refresh command; and
a refresh control circuit coupled to and between the memory array and the command decoder, the refresh control circuit configured to:
identify that a memory bank associated with the target address is in a closed state; and
block capturing of the target address when the memory bank is in the closed state.

2. The memory device of claim 1, wherein:
the refresh command is a command associated with the precharging operation that includes the target address and a direct refresh management (DRFM) indicator for commanding the memory device to capture the target address for a commanded refresh operation for the DRFM;
the command decoder is configured to:
coordinate the precharging operation; and
generate a DRFM capture signal independent of the closed state of the memory bank for coordinating a DRFM portion of the refresh command; and
the refresh control circuit includes DRFM control logic configured to process the DRFM capture signal downstream from the command decoder by blocking the capture of the target address and retaining a previously provided address when the memory bank is in the closed state.

3. The memory device of claim 2, wherein:
the command decoder is configured to (1) activate a bank activation signal for activating the memory bank and/or (2) deactivate the bank activation signal for initiating the precharging operation for the memory bank;
the DRFM control logic is configured to:
receive the bank activation signal representative of the closed state of the memory bank; and
block propagation of the DRFM capture signal when the bank activation signal is deactivated when the DRFM capture signal from the command decoder is received.

4. The memory device of claim 3, wherein the DRFM control logic includes a flip flop configured to (1) receive at least the bank activation signal, the DRFM capture signal from the command decoder, and/or one or more derivations thereof as inputs and (2) control propagation of the DRFM capture signal according to the bank activation signal.

5. The memory device of claim 3, wherein the DRFM control logic includes a NAND component configured to (1) receive at least the bank activation signal, the DRFM capture signal from the command decoder, and/or one or more derivations thereof as inputs and (2) control propagation of the DRFM capture signal according to the bank activation signal.

6. An apparatus, comprising:
a memory array including a plurality of memory cells configured to store data;
a command decoder coupled to the memory array and configured to process an externally-provided command corresponding to a precharging operation and includes an indication for a commanded refresh operation, both operations associated with a target address, wherein the command decoder process the command by (1) initiating the precharging operation and (2) passing an internal capture command with the target address for downstream processing; and
a refresh control circuit coupled to and between the memory array and the command decoder, the refresh control circuit configured to:
receive the internal capture command;
identify whether a memory bank associated with the target address is in an opened state or a closed state; and
controlling propagation of the internal capture command based on the opened or closed state of the memory bank, wherein propagation of the internal capture command corresponds to storing the target address for use during subsequent implementation of the commanded refresh operation.

7. The apparatus of claim 6, wherein the refresh control circuit is configured to propagate the internal capture command to store the target address when the memory bank is in the opened state.

8. The apparatus of claim 6, wherein the refresh control circuit is configured to block propagation of the internal capture command to ignore the target address and maintain a previously stored address for use during the subsequent implementation of the commanded refresh operation.

9. The apparatus of claim 6, wherein:
the command decoder is configured to (1) activate a bank activation signal for activating the memory bank and/or (2) deactivate the bank activation signal for initiating the precharging operation for the memory bank; and
the refresh control circuit includes one or more logic devices configured to control the propagation of the internal capture command according to the bank activation signal.

10. The apparatus of claim 9, wherein the one or more logic devices include a flip flop configured to (1) receive the internal capture command and the bank activation signal as inputs and (2) generate the internal capture command according to the activated state of the bank activation signal or a transition to the deactivated state thereof.

11. The apparatus of claim 9, wherein the one or more logic devices include a NAND device configured to (1) receive at least the internal capture command and the bank activation signal as inputs and (2) control propagation of the internal capture command according to the activated state of the bank activation signal.

12. The apparatus of claim 6, wherein the apparatus comprises a dynamic random-access memory (DRAM).

13. The apparatus of claim 12, wherein:
the DRAM is a double data rate 5 (DDR5) device;
the externally-provided command includes an indication for a direct refresh management (DRFM) row address sampling command for commanding the DRAM to capture the target address for use during the commanded refresh operation; and
the commanded refresh operation is a row hammer refresh operation initiated by a memory controller to refresh one or more sets of wordlines surrounding the target address representative of a hammered wordline.

14. The apparatus of claim 13, wherein the externally-provided command is one of (1) a write pattern with auto precharge command, (2) a write with auto precharge command, (3) a read with auto precharge command, and (4) a precharge per bank command.

15. A method of operating an apparatus, the method comprising:
receive a command from a memory controller, wherein the command corresponds to a precharging operation and a commanded refresh operation both associated with a target address;
using a command decoder, initiating the precharging operation based on the received command; and
using a bank logic downstream from the command decoder to—
(1) identify an operating state of a memory bank associated with the target address, wherein the operating state corresponds to an opened state or a closed state of the memory bank, and
(2) control processing of the target address according to the operating state of the memory bank.

16. The method of claim 15, wherein using the bank logic to control processing of the target address includes storing the provided target address for subsequent implementation of the commanded refresh operation when the memory bank is in the opened state.

17. The method of claim 15, wherein using the bank logic to control processing of the target address includes ignoring the provided target address and retaining a previously provided address for subsequent implementation of the commanded refresh operation when the memory bank is in the closed state.

18. The method of claim 15, wherein using the bank logic to control processing of the target address includes:
providing at least (1) an internal capture command generated by the command decoder in response to the received command and (2) a bank activation command used by the command decoder to control the operating state of the memory bank as inputs to a flip flop; and
propagating the internal capture command or a derivation thereof from the flip flop for enabling capture of the target address when the bank activation command indicates the opened state or transitions to the closed state.

19. The method of claim 15, wherein using the bank logic to control processing of the target address includes:
providing at least (1) an internal capture command generated by the command decoder in response to the received command and (2) a bank activation command used by the command decoder to control the operating state of the memory bank as inputs to a NAND circuit; and
blocking propagation of the internal capture command using the NAND circuit to ignore the target address and retain a previously provided address when the bank activation command indicates the closed state.

20. The method of claim 15, wherein:
using the bank logic downstream to control processing of the target address includes ignoring the target address and retaining a previously stored address when the memory bank is in the closed state, wherein the previously stored address corresponds to a previous direct refresh management (DRFM) sampling command;
the method further comprising:
receiving a DRFM refresh command from the memory controller after the received command; and
implementing the commanded refresh operation according to the previously stored address by refreshing data stored in one or more sets of wordlines surrounding the previously stored address.

\* \* \* \* \*